US006947493B2

(12) United States Patent
Cohen et al.

(10) Patent No.: US 6,947,493 B2
(45) Date of Patent: Sep. 20, 2005

(54) DUAL PHASE PULSE MODULATION DECODER CIRCUIT

(75) Inventors: Daniel S. Cohen, Baltimore, MD (US); Daniel J. Meyer, Woodstock, MD (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 10/836,710

(22) Filed: Apr. 29, 2004

(65) Prior Publication Data

US 2005/0078018 A1 Apr. 14, 2005

Related U.S. Application Data

(60) Provisional application No. 60/509,487, filed on Oct. 10, 2003.

(51) Int. Cl.[7] .......................... H04L 27/04; H04L 27/12; H04L 27/20

(52) U.S. Cl. ............................ 375/295; 341/53; 341/68

(58) Field of Search ............................ 375/295; 341/53, 341/68

(56) References Cited

U.S. PATENT DOCUMENTS

| | | | | |
|---|---|---|---|---|
| 4,003,085 A | * 1/1977 | Wu | 360/40 |
| 4,049,909 A | 9/1977 | Peck | 178/67 |
| 4,218,770 A | 8/1980 | Weller | 375/118 |
| 4,238,854 A | * 12/1980 | Ehrsam et al. | 713/165 |
| RE30,482 E | 1/1981 | Whitlock | 360/32 |
| 4,408,166 A | 10/1983 | Moeller | 329/106 |
| 4,592,072 A | 5/1986 | Stewart | 375/55 |
| 4,641,323 A | 2/1987 | Tsang | 375/80 |
| 4,686,484 A | 8/1987 | Otani | 329/109 |
| 4,931,751 A | 6/1990 | Keller et al. | 332/108 |
| 4,951,159 A | 8/1990 | Van Beek | 358/455 |
| 5,027,372 A | 6/1991 | Wong | 375/67 |
| 5,157,693 A | 10/1992 | Lemersal, Jr. et al. | 375/67 |
| 5,175,549 A | 12/1992 | Back | 341/152 |
| 5,202,643 A | 4/1993 | Sato | 329/309 |
| 5,379,323 A | 1/1995 | Nakaya | 375/85 |
| 5,408,499 A | 4/1995 | Sasaki | 375/286 |
| 5,428,321 A | 6/1995 | Yoshida et al. | 332/109 |
| 5,442,664 A | 8/1995 | Rust et al. | 375/371 |
| 5,506,873 A | 4/1996 | Suzuki | 375/324 |
| 5,614,861 A | 3/1997 | Harada | 329/308 |
| 5,625,645 A | 4/1997 | Greier et al. | 375/276 |
| 5,627,500 A | 5/1997 | Wolaver et al. | 332/112 |
| 5,640,160 A | * 6/1997 | Miwa | 341/53 |
| 5,652,552 A | 7/1997 | Chung | 332/104 |
| 5,696,790 A | * 12/1997 | Graham et al. | 375/238 |
| 5,841,816 A | 11/1998 | Dent et al. | 375/331 |
| 5,963,074 A | 10/1999 | Arkin | 327/276 |
| 5,977,821 A | 11/1999 | Shibata | 329/306 |
| 6,025,758 A | 2/2000 | Lu | 332/100 |
| 6,031,472 A | * 2/2000 | Johnson et al. | 341/58 |
| 6,094,450 A | 7/2000 | Shockey | 375/141 |
| 6,115,428 A | 9/2000 | Kim | 375/308 |
| 6,204,726 B1 | 3/2001 | Toshinori | 329/304 |
| 6,212,230 B1 | * 4/2001 | Rybicki et al. | 375/239 |
| 6,255,866 B1 | 7/2001 | Wolaver et al. | 327/107 |
| 6,297,691 B1 | 10/2001 | Anderson et al. | 329/300 |
| 6,429,693 B1 | 8/2002 | Staszewski et al. | 327/12 |
| 6,439,679 B1 | 8/2002 | Roylance | 347/9 |
| 6,473,252 B1 | * 10/2002 | Graham | 360/40 |
| 2003/0035496 A1 | 2/2003 | Noda | 375/308 |
| 2003/0084079 A1 | * 5/2003 | Awad et al. | 708/322 |
| 2003/0198478 A1 | 10/2003 | Vrazel et al. | 398/183 |
| 2004/0095264 A1 | * 5/2004 | Thomas | 341/53 |

* cited by examiner

*Primary Examiner*—Stephen Chin
*Assistant Examiner*—Jia Lu
(74) *Attorney, Agent, or Firm*—Schneck & Schneck; Thomas Schneck; Mark Protsik

(57) ABSTRACT

A dual phase pulse modulation (DPPM) decoder circuit processes a DPPM signal, which is in the form of a series of high and low pulses whose pulse widths represent successive groups of M data bits, so as to recover data carried by the signal. Each of the $2^M$ possible data values of an M-bit group corresponds to one of $2^M$ distinct pulse widths. Circuit blocks determine the width of each pulse by piping the DPPM signal through a short delay chain and using the delayed outputs to clock flip-flop registers to sample the non-delayed signal. The registered output is interpreted by logic gates to obtain the corresponding M-bit groups. The decoder circuit may have two substantially identical pulse width determining blocks, one receiving the DPPM signal for measuring high pulses, and the other receiving an inverted DPPM signal for measuring the low pulses.

8 Claims, 3 Drawing Sheets

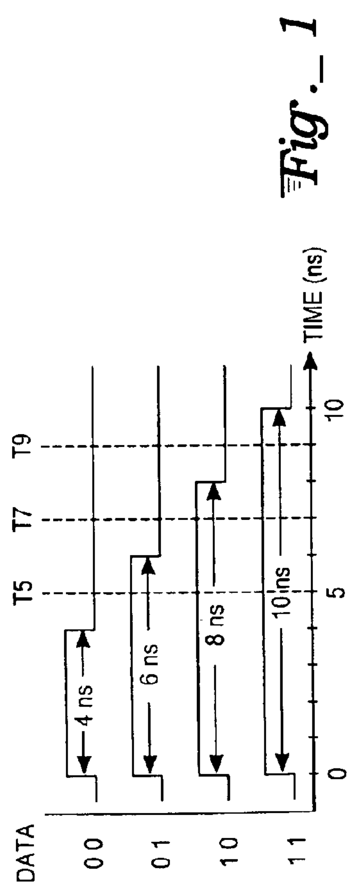
Fig._1
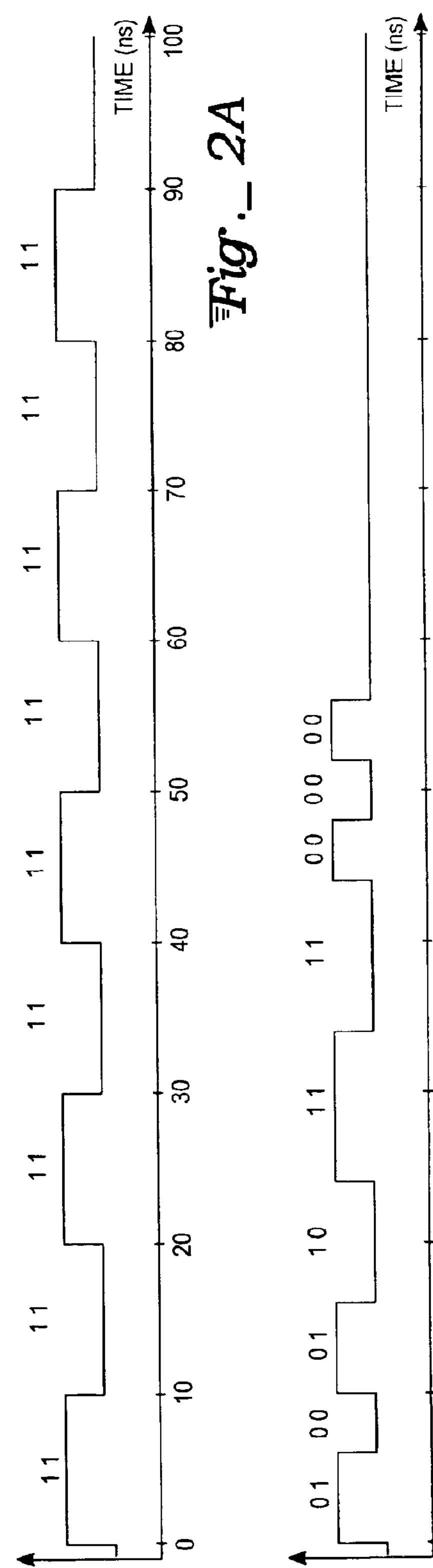
Fig._2A
Fig._2B

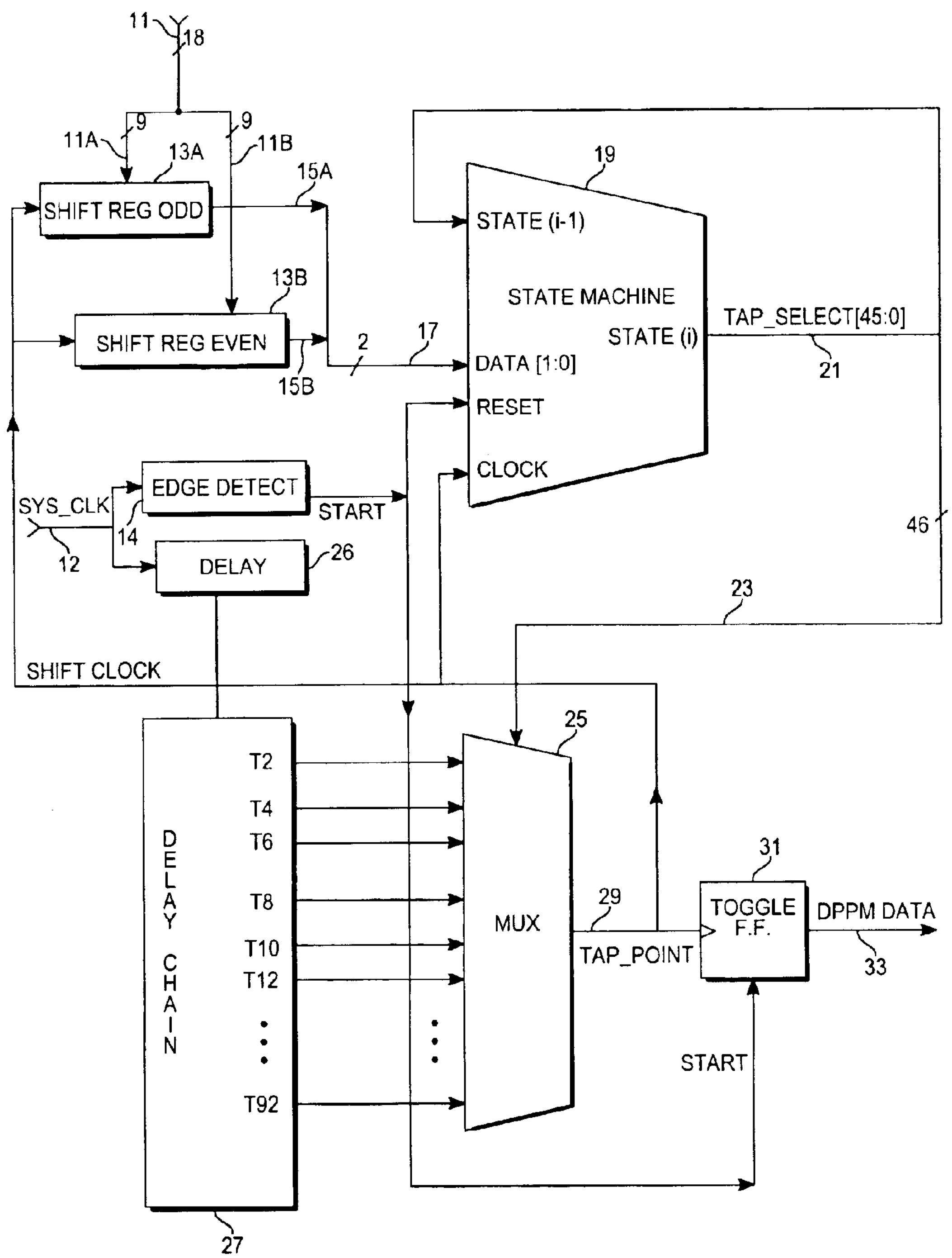
Fig._3

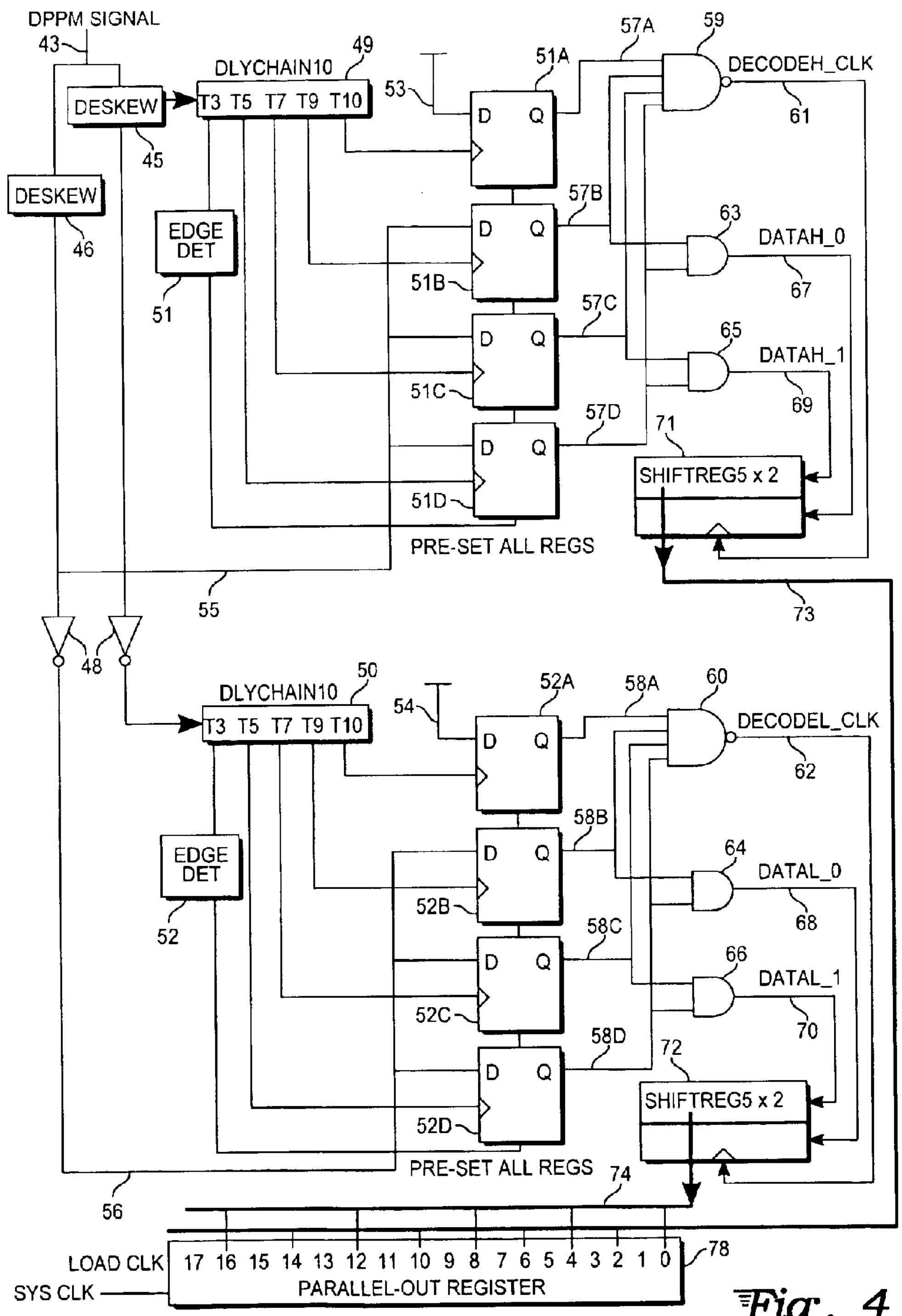
Fig._4

DUAL PHASE PULSE MODULATION DECODER CIRCUIT

CROSS-REFERENCE TO RELATED APPLICATION

This application claims the benefit under 35 U.S.C. 119(e) from U.S. provisional application No. 60/509,487, filed on Oct. 10, 2003.

TECHNICAL FIELD

The present invention relates to modulation of digital data for signal transmission and corresponding demodulation of received signals to recover digital data carried thereby, and relates especially to the particular type of modulation used to encode the data, such as pulse-duration (width) modulation (PDM or PWM), on/off keying, non-return-to-zero (NRZ) schemes, differential phase-shift keying (DPSK), multiple-frequency-shift keying (MFSK), and various forms of multi-bit/N-ary encoding.

BACKGROUND ART

The different types of communication signals are typically classified according to modulation type. Each of the various forms of modulation has its own set of advantages and disadvantages relative to a specific application for which it will be used. Some factors to consider in choosing a particular form of modulation include bandwidth, power consumption requirements, and the potential for signal propagation errors and recovery of the original information. For digital data, whether a separate clock signal is required or the modulated signal is self-clocking may be important. The relative simplicity or complexity of the modulating and demodulating equipment or circuitry may also be a factor in the decision. Low power consumption is particularly sought for use with capacitive-loaded transmission lines.

Each type of signal modulation has specialized decoder circuitry for performing the demodulation and data recovery. For example, for demodulation of a phase-modulated signal, U.S. Pat. No. 5,614,861 to Harada describes a system that employs a set of phase detectors with one input receiving the signal and at least one other input receiving a clock of specified phase delay. The results of the phase detection are input into data generation circuitry comprising logic gates for converting the detection results into a pair of data bits. In contrast, for demodulating a phase-shift-keyed signal, U.S. Pat. No. 6,204,726 to Toshinori includes a phase detector that compares an input signal against a divided master clock signal, the results of which are then logically processed, for example with a delaying circuit, subtractor, clock signal regenerator, phase compensator, adder and decision unit, to obtain a data bit for each keyed phase shift in the signal. A decoder circuit for a low power, high bandwidth, pulse width type of signal modulation would be desirable.

DISCLOSURE OF THE INVENTION

The present invention is a dual phase pulse modulation (DPPM) decoder circuit that processes a DPPM signal, which is in the form of a series of high and low pulses whose time durations (or "pulse widths") represent successive M-bit groups of data bits, so as to recover the data carried by the signal. Each of the $2^M$ possible data values of an M-bit group uniquely corresponds to one of $2^M$ distinct pulse widths. Both the high signal pulses and the low signal pulses represent M-bit data. The decoder converts the series of signal pulses back into an ordered sequence of data bits without requiring an independent or recovered clock.

More particularly, the decoder circuit may be implemented with separate high and low pulse width determining circuits, each substantially identical, with the circuit block dedicated to determining the width of the high pulses being coupled to receive the DPPM signal directly from a signal input, but with the circuit block dedicated to determining the width of the low pulses coupled to the signal input through a signal inverter. The groups of data bits recovered by both circuit blocks may then be interleaved and combined into data words in a parallel output register.

The pulse widths may be determined by piping the modulated signal through a short delay chain and then using the delayed outputs to clock flip-flop registers to sample the non-delayed signal. The delay chain provides specified delays relative to a leading signal pulse edge that are selected to fall between expected pulse transition times for the various pulses representing the set of possible M-bit data values. The registered output from the flip-flops may be interpreted by a set of logic gates or other logic means for converting the determined pulse widths into corresponding groups of M-bit data.

DETAILED DESCRIPTION OF THE DRAWINGS

FIG. 1 is a graphic illustration (signal value versus time) of a set of DPPM pulses of various pulse durations for representing a corresponding set of dibit data symbols in accord with the present invention.

FIGS. 2*a* and 2*b* are graphical illustrations of DPPM pulse trains in accord with the present invention for a set of exemplary data, showing transmission of a series of 9 high and low going pulses within a single 100 ns system clock period.

FIG. 3 is a schematic circuit diagram of an exemplary DPPM encoder circuit for use in generating DPPM signals that are demodulated by the decoder of the present invention.

FIG. 4 is a schematic circuit diagram of an exemplary DPPM decoder circuit of the present invention.

BEST MODE FOR CARRYING OUT THE INVENTION

The present invention is a decoder circuit (an embodiment of which is shown in FIG. 4) that converts dual phase pulse modulated (DPPM) signals back into their digital data representation. DPPM is a method of representing data, resident in digital circuitry in the form of binary circuit states (ones and zeros), as a string of alternating high and low signal pulses whose respective durations or widths represent 2 (or more) bits of data per pulse. An exemplary embodiment shown in FIG. 1 uses 2 bits for encoding. The pairs of bits are encoded using a set of distinct pulse widths representing each possible dibit symbol value, such as:

00=4 ns pulse

01=6 ns pulse

10=8 ns pulse

11=10 ns pulse

The choice of 4, 6, 8, and 10 ns pulse widths is arbitrary and could just as well have been 4, 5, 6, and 7 ns or some other pulse widths, provided the decoding circuitry at the receiving end of a DPPM signal transmission can correctly distinguish the different pulse widths from each other. The decoding circuitry (as well as process variation, noise and signal degradation, and temperature/voltage variation in the propagating environment) also establishes a practical limit to the number of bits that can be encoded per pulse, with 3 bits per pulse having 8 (=$2^3$) possible pulse widths needing to be correctly resolved and 4 bits per pulse having 16 (=$2^4$) possible pulse widths needing to be correctly resolved. The data rate can be considered to be the number of encoded bits per second (or alternatively, the number of pulses per second), which depends on the number of pulses per system clock and on the system clock frequency.

"Dual Phase" refers to the fact that the information is sent as both the high-going pulses and the low-going pulses. Most pulse width modulation schemes simply vary the width of the high going pulse and therefore are really modulating the duty cycle. DPPM independently modulates the width of both high and low going pulses, with different groups of bits encoded in the high and low portions of each "cycle." Therefore, clock period and duty cycle are not valid concepts with respect to the generated pulse train. DPPM is by its nature "clockless," meaning the data can be decoded by simply detecting the width of the pulse with respect to each transition. This means that no clock need be sent with the data, nor must a clock be encoded and recovered from the data. This is a major advantage when transmitting time critical bursts between different chips, since it removes the necessity of manipulating a clock which would introduce opportunity for timing variance and error. The only clock consideration is the fact that several pulse "cycles" will be sent within each system clock period. For example, FIGS. 2*a* and 2*b* show examples of DPPM pulse trains of alternating high and low pulses (5 high pulses and 4 low pulses) transmitting 18 bits of data (organized here as 9 dibits) in a 100 ns system clock period. These 18 bits can form, for example, a 16-bit data word with two error correction code bits appended to the word. Thus one data word may be transmitted per system clock period.

Since information is sent on both positive and negative phases of the pulse train, DPPM is by its nature a non-return-to-zero (or non-return-to-one) modulation scheme. However, it is typically desired that the sequence of pulses contained within a system clock period return to zero (or one) at the end of each such sequence. This preference is most easily implemented when, as in the FIGS. 2*a* and 2*b* examples, the number of multi-bit symbols in a word to be represented as pulses is odd, since the final symbol in the sequence requires a return to zero (or return to one) as the trailing transition of the last pulse. However, this rule needn't be followed if an extra pulse is inserted by the encoder and ignored by the decoder to force a return.

Thus, the DPPM method represents groups of M data bits, such as dibits (M=2), as signal pulses of specified widths. Each of the $2^M$ possible data values corresponds to one of $2^M$ distinct pulse widths, and successive groups of M data bits are represented by signal pulses that are alternately high and low. Signal encoding and decoding circuitry performs the conversion between the data bit and signal pulse representations of the information content.

For encoding data bits as signal pulses, received data words are first subdivided into an ordered sequence of groups of M data bits, then each group in the sequence is converted into its corresponding signal pulse representation, thus producing a series of high and low signal pulses that represent the data. One way to perform the conversion of data words into signal pulses is to specify signal pulse transition times, each corresponding to a preceding transition time that is incremented by a specified pulse width corresponding to a present group of M data bits, and then producing signal pulse transitions at those specified transition times. The exemplary encoder hardware that is described below with reference to FIG. 3 performs the conversion in this way.

For decoding a DPPM signal back into data, the pulse width for each of the high and low signal pulses is determined, then converted back into an ordered sequence of groups of M data bits, and recombined into data words. One way to perform this conversion is carried out by the exemplary decoder hardware set forth in the following description with reference to FIG. 4.

An Encoder Circuit for Use with the Present Invention:

With reference to FIG. 3, an exemplary DPPM encoder circuit receives data words (e.g., 18 bits grouped into 9 dibits) on a parallel data input bus 11, here divided into two parts 11A and 11B. A load signal (not shown) indicates when data is available. If no data is available, the DPPM encoder is held idle. Sys_Clock 12 is a system clock that is also created externally to the DPPM encoder.

The circuit takes the received data on the odd and even data buses 11A and 11B and, synchronously to the system clock, loads it into two parallel-in, serial-out shift registers 13A and 13B. The odd bits (i.e., bits 1, 3, 5, 7, 9, 11, 13, 15, and 17) are loaded from bus lines 11A into the other shift register 13A (Shift Reg Odd). The even bits (i.e., bits 0, 2, 4, 6, 8, 10, 12, 14, and 16) are loaded from bus lines 11B into one shift register 13B (Shift Reg Even).

The contents of the registers are then serially shifted out in pairs 15A and 15B. A Shift Clock pulse fed from the multiplexer output 29 ensures that successive shifts of data out of the registers 13A and 13B are synchronized to the end of each DPPM signal pulse. In this way, the data words are subdivided into an ordered sequence of groups of M data bits each (here, M=2). If the data were to be divided instead into groups of three or four bits each, then the input bus 11 would typically be divided into three or four parts loading into three or four shift registers, each shift register providing one of the bits of each group on its serial output.

The register outputs 15A and 15B are connected to an input 17 to a state machine 19, whose N-bit output 21 is a function of its current value and the 2-bit pair to be encoded. In particular, the state machine 19 iteratively increments its state by an amount corresponding to the pulse widths for the successive 2-bit pairs received at state machine input 17. The N-bit output 21 has only one active bit and is used as an input 23 to control an multiplexer 25 for selecting the successive taps from the current-controlled delay chain 27. The multiplexer output 29 is used to clock a toggle flip-flop 31 and thus encode the data on its output 33 as a series of high and low pulses whose width represents the value of the 2-bit pair.

An edge detector circuit 14, which may be any known edge detector, issues a start pulse of 2 to 3 ns duration at each rising edge of the system clock, Sys_Clock. The start pulse resets the state machine 19 to a first tap selection state (tap_select[44:1]=0 and tap_select[0]=1). The start pulse also sets the toggle flip-flop 31 to its 'set' state (output high). A 1 ns pulse synchronous to the system clock is presented on input 12 to the start of a 92-element delay chain 27. A first delay element 26, shown separately, takes into account the time involved in loading the shift registers 13A and 13B and presenting the first pair of data bits to the state machine 19.

Each element in the delay chain 27 is here calibrated to have a 1 ns delay. Therefore, the pulse takes 92 ns to travel down the delay chain. Assuming that a first DPPM signal transition occurs at a time delay of 2 ns (corresponding to tap_select[0]), the delay chain's size corresponds to the maximum total time needed to represent a complete 18-bit word as a series of DPPM signal pulses, when using the set of pulse widths described above for FIG. 1. That is, a time duration of 90 ns is required to transmit nine "11" bit pairs as nine high and low signal pulses of 10 ns pulse width. If other word sizes and pulse width sets are chosen, the number of delay elements, and possibly even the amount of time delay per element, will change accordingly. The period of the system clock must exceed the total duration of a sequence of signal pulses when all are of the maximum pulse width. If a delay-locked loop (DLL) is used to calibrate the delay chain to the system clock, then pulse widths will be automatically scaled for different system clocks.

The least significant bits in the two shift registers 13A and 13B represent the current bit pair to be encoded and are input from lines 17 into a tap selector state machine 19. This state machine 19 selects a tap point for the 92-element delay chain 27. The pulse widths may be 4, 6, 8 or 10 ns for the four possible bit pairs, in which case the valid tap points are only on the even delay elements, so that there are 46 valid tap points in this implementation. (However, the choice of pulse widths is arbitrary and another set of pulse widths could be chosen. The choice of pulse widths is based on the need to provide enough separation such that the decoder can accurately distinguish between them. "Enough" is determined by factors such as desired error/noise margin, amount of noise in the system, and characteristics of the technology used, including process variation, switching speed, and setup/hold requirements.)

The tap point selection 21 is incremented based on the present tap point (STATE(i)) and the next 2-bit data (DATA [1:0]) to be encoded. The tap selects are preferably implemented as a one-shot state machine 19 —essentially a shift register capable of multiple shifts per cycle—where a single active state is incremented by 2, 3, 4, or 5 positions on each clock, depending upon the 2-bit data value input from data lines 17. While requiring a register for every state is area-inefficient, this implementation allows for extremely fast switching of states and therefore quick control of the multiplexer 25. There is a one-to-one correspondence between the tap selection 21 that is output from the state machine 19 and the delay chain tap, T2 through T92, that is selected by the multiplexer 25. The timing is such that the tap point must increment to the next value before the rising edge propagating down the delay chain reaches the next tap point.

The tap point selection 21 is the selector control 23 for the multiplexer 25. The output 29 of the multiplexer 25 is a 1 ns pulse that occurs once at each selected tap point. This multiplexer output 29 clocks a toggle flip-flop 31 and also forms the Shift Clock pulse that shifts the data in the shift registers 13A and 13B and clocks the state machine 19 from one state to the next. The output 33 of the toggle flip-flop 31 is the DPPM output of the entire encoder circuit of FIG. 3.

A Decoder Circuit in Accord with the Present Invention:

With reference to FIG. 4, an exemplary DPPM decoder circuit of the present invention processes serial DPPM signals received on an input 43 to obtain a parallel data output from an output register 78. Sys_Clock is a system clock that is created externally to the DPPM decoder. Deskew blocks 45 and 46 allow independent fine-tuning of delay on the DPPM signal that is used for clocking the D-flip-flops 51A–51D and 52A–52D and providing the data that is sampled by those same flip-flops. The amount of deskew may be controlled, for example, by a register (not shown) that tunes a venier circuit in each of the blocks 45 and 46. The high and low pulses are decoded separately. Inverters 48, coupled to the DPPM signal input 43 through the deskew blocks 45 and 46, invert the DPPM signal pulses so that substantially identical subcircuits can be used for decoding both the high and low pulses, as explained further below.

In general, the value of the data is determined by detecting the pulse widths with respect to the leading edge of each pulse. The modulated signal representing the data is piped through a short delay chain and outputs are used to clock and sample the non-delayed signal. As a result, the decoding requires no independent or recovered clock. More specifically, the serial-to-parallel DPPM data decoder includes two delay chains 49 and 50, each having K−1 outputs representing different stages of the delay chain, where K is the number of different delay values representing encoded data. For 2-bit encoding, K=4 (for 3-bit encoding, K=8, etc).

Returning to FIG. 1, for an implementation using 2-bit encoding, the data may be represented, for example, as 4, 6, 8, and 10 ns pulse widths. By sampling a pulse at times T5, T7, and T9 between the various possible trailing edge times for the different encoded pulse width values, the length of the pulse can be determined and then decoded back into its constituent pair of data bits. Thus, at a time T5 (i.e., 5 ns after the pulse leading edge), a 4 ns pulse encoding the dibit data value 00 will already have ended, whereas pulses encoding other dibit data values will not yet have transitioned at their trailing edge to the opposite signal state. Likewise, at time T7, a 6 ns pulse encoding data value 01 will also have ended, and later at time T9, an 8 ns pulse encoding data value 10 will have ended, but a 10 ns pulse encoding data value 11 will still continue for another nanosecond.

As seen in FIG. 4, the rising edge of a data pulse is sent through a first delay chain 49 and appears at T5, T7, and T9, which are used to clock a set of flip-flops 51B–51D and thus sample the data pulse presented on line 55. For low-going pulses, the incoming DPPM signal is first inverted, then sent through a second delay chain 50 that is used with another set of flip-flops 52B–52D to sample the inverted data pulse presented on line 56. High and low pulses are therefore independently decoded. Also, by using two delay chains with the low pulses inverted before sampling, it is possible to decode the DPPM signal using only rising edges traveling through the delay chains. This produces the added benefit of avoiding dispersion of rise/fall data pulses within the delay chain.

The logic AND gates 63–66 convert the sampled pulse values that are output from the flip-flops 51–51D and 52B–52D on lines 57B–57D and 58B–58D into their corresponding data values.

It can be seen that the DPPM method allows for pulse widths to be decoded with respect to the leading edges of pulses, and therefore does not require a clock. This means that no extra clock lines, clock encoding, or clock recovery circuits are required on the receiver. In fact, because delayed versions of the data pulses are actually used to clock (or sample) the incoming non-delayed data pulses, this decoding technique produces an added benefit of eliminating the possibility of introducing error when manipulating or recovering a clock.

What is claimed is:

1. A dual phase pulse modulation (DPPM) decoder circuit, comprising:

a DPPM signal input configured to receive a DPPM signal consisting of a series of alternately high and low signal pulses of specified widths corresponding to M-bit groups of data bits; where M is an integer greater than zero a signal inverter coupled to the DPPM signal input;

high and low pulse width determining circuit blocks coupled to the DPPM signal input, the low pulse width determining circuit block coupled to the DPPM signal input via the signal inverter, each pulse width determining circuit block constructed to output M-bit data values corresponding to pulse widths of the respective high and low signal pulses;

a parallel output register coupled to the high and low pulse width determining circuit blocks, the parallel output register configured to receive and interleave the M-bit data values and to output a data word corresponding to the DPPM signal.

2. The DPPM decoder circuit as in claim 1, wherein each pulse width determining circuit block comprises:

means for registering states of the DPPM signal for each pulse after a set of specified delays relative to a leading signal pulse edge, the specified delays being selected to fall between expected pulse transition times for the set of possible M-bit data values; and logic means, coupled to outputs of the registering means, for converting the set of registered DPPM signal states to the corresponding M-bit data value for each signal pulse.

3. The DPPM decoder circuit as in claim 2, wherein the means for registering comprises a plurality of D-flip-flop registers having respective data inputs coupled to the DPPM signal input and having respective clock inputs coupled to taps of a delay chain corresponding to the set of specified delays, the delay chain having an input coupled to the DPPM signal input.

4. The DPPM decoder circuit as in claim 1, wherein each pulse width determining circuit block includes:

a delay chain configured to receive and propagate a DPPM signal pulse to a plurality of taps;

an edge detector coupled to a first of the taps;

a plurality of flip-flops having clock inputs coupled to respective taps subsequent to the first tap, the flip-flops being pre-set by an edge detector output, the flip-flops having data inputs coupled to receive and sample the DPPM signal pulse;

logic gates coupled to outputs of the flip-flops and configured to convert the sampled pulse to an M-bit data value according to its determined pulse length; and a shift register configured to receive data values for successive high or low pulses of the same level and load the data values in parallel to the parallel output register.

5. A method of operating a dual phase pulse modulation (DPPM) decoder circuit to convert a series of signal pulses into data, comprising:

receiving a DPPM signal in the form of a series of alternately high and low signal pulses, each high or low signal pulse characterized by any of $2^M$ possible discrete pulse widths uniquely corresponding to $2^M$ possible data values of an M-bit group of data bits;

sampling the DPPM signal after each of a plurality of delay times to determine a pulse width and corresponding M-bit data value for each of said signal pulses; and combining successive M-bit data values into data words.

6. The method as in claim 5, wherein sampling the DPPM signal to determine data values for each signal pulse in the DPPM signal, comprises:

providing the received DPPM signal to a data input of each of $2^M-1$ flip-flop registers and a logic high state to a data input of a final flip-flop register; where M is an integer grater than detecting a leading pulse edge in the received DPPM signal and pre-setting all of the flip-flop registers in response to detection of that leading edge;

delaying the received DPPM signal by a plurality of specified delay times and providing each delayed DPPM signal to a clock input of a different one of the flip-flop registers, the delay times selected to fall between expected pulse transition times for the set of $2^M$ possible discrete pulse widths and also after the last expected pulse transition time; and logically converting a set of signal states of the flip-flop registers to a corresponding M-bit data value for each signal pulse.

7. The method as in claim 6, wherein the converting of low pulses into data is performed by a separate circuit block from the converting of high pulses into data, each circuit block being substantially identical and the DPPM signal being inverted prior to being received by the circuit block dedicated to converting the low pulses, the detecting of a leading pulse edge being performed as a detecting of a rising pulse edge by each circuit block.

8. The method as in claim 5, wherein combining successive M-bit data values into data words comprises loading the data values obtained from each signal pulse into a shift register and outputting the contents of the shift register at an end of each system clock period, each system clock period characterized by a plurality of signal pulses of the received DPPM signal representing a data word.

* * * * *

UNITED STATES PATENT AND TRADEMARK OFFICE

CERTIFICATE OF CORRECTION

PATENT NO. : 6,947,493 B2
APPLICATION NO. : 10/836710
DATED : September 20, 2005
INVENTOR(S) : Daniel S. Cohen and Daniel J. Meyer It is certified that error appears in the above-identified patent and that said Letters Patent is hereby corrected as shown below:

Column 6, lines 50-51 : "… from the flip-flops 51-51D and 52B-52D…" should read:

--… from the flip-flops 51B-51D and 52B-52D…-- .

Column 8, claim 6, lines 19-20: "...final flip-flop register; where M is an integer grater than detecting a leading pulse edge …" should read:

-- … final flip-flop register, where M is an integer greater than zero; detecting a leading pulse edge…--.

Signed and Sealed this

Second Day of January, 2007

JON W. DUDAS
*Director of the United States Patent and Trademark Office*